(12) United States Patent
Ueda et al.

(10) Patent No.: US 7,197,055 B2
(45) Date of Patent: Mar. 27, 2007

(54) SEMICONDUCTOR LASER

(75) Inventors: Tetsuo Ueda, Ibaraki (JP); Masahiro Kume, Otsu (JP); Toshiya Kawata, Okayama (JP); Isao Kidoguchi, Kawanishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 202 days.

(21) Appl. No.: 11/070,267

(22) Filed: Mar. 3, 2005

(65) Prior Publication Data

US 2005/0232325 A1    Oct. 20, 2005

(30) Foreign Application Priority Data

Mar. 31, 2004    (JP)    ............................... 2004-107783

(51) Int. Cl.
*H01S 5/00*    (2006.01)
(52) U.S. Cl. ............................... 372/45.01; 372/46.01; 372/46.015; 372/46.016
(58) Field of Classification Search ............. 372/46.01
See application file for complete search history.

(56) References Cited

U.S. PATENT DOCUMENTS 5,119,387 A  *  6/1992  Kinoshita ................ 372/46.01

FOREIGN PATENT DOCUMENTS

JP    2003-78203    3/2003

\* cited by examiner

*Primary Examiner*—Armando Rodriguez
(74) *Attorney, Agent, or Firm*—McDermott Will & Emery LLP

(57) ABSTRACT

In a semiconductor laser 1, a current blocking layer 19 covers a p-type $2^{nd}$ cladding layer 17 and a p-type cap layer 18 that extend in a lengthwise direction of an optical resonator, at both a light-emission end and an end opposite the light-emission end, to thus form non-current injection regions in an optical waveguide. By making current blocking layer 19 at the light-emission end large enough that carriers flowing from a current injection region do not reach the light-emission end surface, the light intensity distribution in the near field at the light-emission end surface is strongly concentrated, allowing the horizontal divergence angle of an emerging laser beam to be enlarged. This structure makes it possible to enlarge the horizontal divergence angle independently after having optimized the thickness of cladding layers and the size of the current injection region.

3 Claims, 16 Drawing Sheets

SEMICONDUCTOR LASER

BACKGROUND OF THE INVENTION

1. Field of the Invention

The present invention relates to semiconductor lasers, and in particular to technology that allows the horizontal divergence angle to be enlarged independently of increases in laser beam output.

2. Related Art

Optical disks such CD (compact disk) and DVD (digital versatile disk) have become widely used in recent years. The demand for recordable optical disk devices is rapidly expanding due to the wide acceptance in consumer use of optical disks as media suitable for recording mass digital information typified by AV (audio visual) contents.

The recording speed of optical disk devices is improved by increasing the light output of semiconductor lasers used in optical pickups. Improving the writing speed furthers the convenience of users and provides a major selling point for products.

This has led to mounting demands for light output increases in 780-nm AlGaAs semiconductor lasers used in optical pickups for CD-R (recordable) and CD-RW (rewritable), for example, and in 650-nm InGaAlP semiconductor lasers used in optical pickups for DVD-R, DVD-RW and DVD-RAM (random access memory), for example.

With semiconductor lasers used in optical pickups, an emerging laser beam having as large a horizontal divergence angle $\theta\|$ as possible, preferably 7.5 degrees or greater, is sought, at the same time as increases in light output.

This is because the laser beam is difficult to condense at small horizontal divergence angles $\theta\|$, and, as a result, a desirable coupling coefficient cannot be obtained in optical coupling with the address pits on optical disk media, leading to noise and jitter.

Semiconductor lasers that respond to these demands have been disclosed to date (e.g., see Japanese Published Patent Application No. 2003-78208; hereinafter "reference 1").

Reference 1 discloses a ridge semiconductor laser having a $1^{st}$ conductive-type cladding layer, an active layer provided on the $1^{st}$ conductive-type cladding layer, a $2^{nd}$ conductive-type cladding layer provided on the active layer and having a ridge that extends parallel to a lengthwise direction of the resonator, and a current-blocking layer provided on either side of the ridge. The features of this invention include the injection of current contracted by the current-blocking layer into the active layer via the upper surface of the ridge, and the $1^{st}$ conductive-type cladding layer being greater in thickness than the $2^{nd}$ conductive-type cladding layer including the ridge.

It is widely known that generally the shape of the ridge, in a cross-section orthogonal to the lengthwise direction of the resonator, is a trapezoid whose upper base is shorter than the lower base, and that while a laser beam having a larger horizontal divergence angle $\theta\|$ is obtained for shorter lower base widths, light output increases are disadvantaged because of the region for injecting current being reduced and device resistance increased for shorter lower base widths.

In other words, for a given thickness of the ridge, increasing light output is counter to expanding the horizontal divergence angle $\theta\|$ of the laser beam.

The semiconductor laser disclosed in reference 1 realizes a laser device in which the upper base of the ridge cross-section is left wide enough to ensure high light output while the lower base is reduced enough to obtain a desirable horizontal divergence angle $\theta\|$, by reducing the thickness of the ridge while keeping this inverse relationship in mind.

However, because of the balancing, in this conventional semiconductor laser, of a desirable horizontal divergence angle $\theta\|$ with device resistance by reducing ridge thickness, the characteristics dependent on ridge thickness are not always optimized.

Specifically, while, on the one hand, device resistance decreases and operating voltage drops when ridge thickness is reduced with the lower base of the ridge fixed at a width that obtains a desired horizontal divergence angle $\theta\|$, on the other hand, waveguide loss is increased (see reference 1, FIG. 6).

The increase in waveguide loss arises because of the laser beam leaking from the $2^{nd}$ conductive-type cladding layer into the contact layer and being absorbed, due to the reduction in ridge thickness.

As such, a problem with conventional semiconductor lasers is that the horizontal divergence angle $\theta\|$ and device resistance together with the characteristics dependent on ridge thickness cannot be managed independently of one another. This problem complicates the process of working out an optimal structure for semiconductor lasers, and impedes the rationalization of semiconductor laser design.

SUMMARY OF THE INVENTION

In view of the above problem, an object of the present invention is to provide a semiconductor laser that allows the horizontal divergence angle $\theta\|$ to be enlarged independently of the characteristics dependent on ridge thickness, after having optimized these characteristics.

To resolve the above problem, the present invention is a semiconductor laser having: an optical resonator formed by processing either end of an optical waveguide to be a partially reflective surface, the optical waveguide being formed from a $1^{st}$ conductive-type cladding layer, an active layer and a $2^{nd}$ conductive-type cladding layer layered in the stated order; and a current blocking layer formed on $1^{st}$ and $2^{nd}$ regions of the optical resonator, the $1^{st}$ region extending a $1^{st}$ length from a light-emission end surface of the optical resonator and the $2^{nd}$ region extending a $2^{nd}$ length from an opposite end surface of the optical resonator. Furthermore, a section of the active layer extending a predetermined length from the light-emission end surface and a section of the active layer extending a predetermined length from the opposite end surface are formed to have an energy bandgap larger than a remaining section thereof, and a horizontal divergence angle of light emerging from the light-emission end surface is managed by setting the $1^{st}$ length to be longer than a distance over which current flowing into the $1^{st}$ region from a $3^{rd}$ region of the optical resonator that excludes the $1^{st}$ and $2^{nd}$ regions is reduced to 1/e by diffusion, where e is a base of a natural logarithm.

Typically, the $1^{st}$ length is at least 4% of the length of the $3^{rd}$ region.

By increasing the length of the $1^{st}$ region (direct injection of current is prevented) enough to allow current flowing from the $3^{rd}$ region to decrease sufficiently before reaching the light-emission end surface, the light intensity distribution in the near field at the light-emission end surface is strongly concentrated, thus making it possible, according to this structure, to enlarge the horizontal divergence angle of the emerging laser beam.

As a result, the process of working out an optimal structure for semiconductor lasers is simplified and semiconductor laser design rationalized, because of being able to enlarge the horizontal divergence angle independently, after having optimized the thickness of cladding layers and the size of the current injection region.

Also, a section of the active layer extending from the light-emission end surface for a length included in a ±20 μm range of the $1^{st}$ length may be formed to have the larger energy bandgap.

According to this structure, it is possible to avoid both an increase in the threshold current arising when the section having the larger energy bandgap is too small in comparison with the $1^{st}$ region, and a drop in the COD (catastrophic optical damage) level arising when the section having the larger energy bandgap is too large in comparison with the $1^{st}$ region.

BRIEF DESCRIPTION OF THE DRAWINGS

These and other objects, advantages, and features of the invention will become apparent from the following description thereof taken in conjunction with the accompanying drawings, which illustrate a specific embodiment of the present invention.

In the drawings.

DETAILED DESCRIPTION OF THE PREFERRED EMBODIMENT

A semiconductor laser pertaining to a preferred embodiment of the present invention is described below while referring to the diagrams.

Structure

Figure 1:
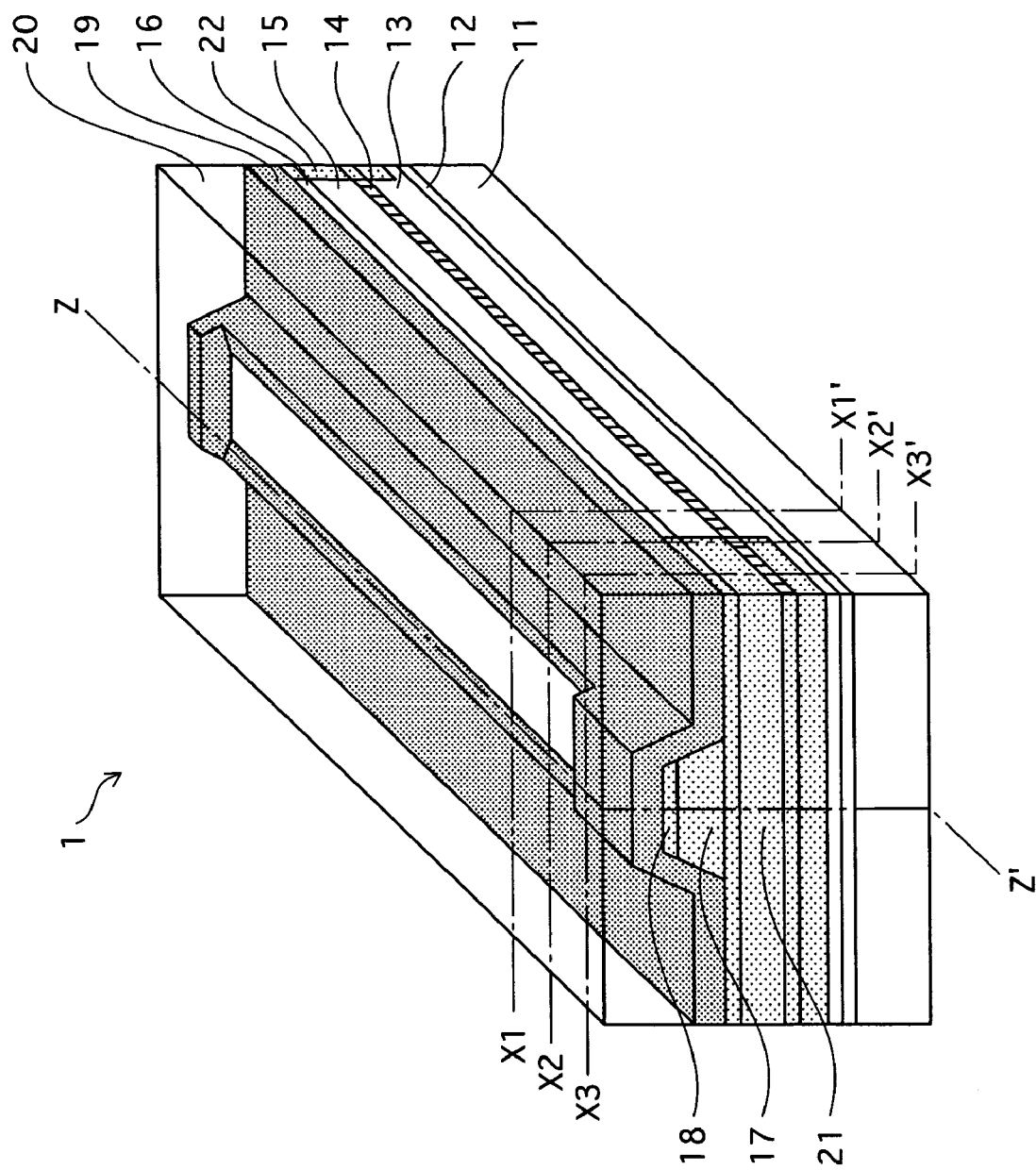
FIG. 1 is a perspective view showing a semiconductor laser in a preferred embodiment.

FIG. 1 is a perspective view showing a semiconductor laser 1.

Semiconductor laser 1 is formed from an n-type semiconductor substrate 11, an n-type buffer layer 12, an n-type cladding layer 13, a quantum-well active layer 14, a p-type $1^{st}$ cladding layer 15, an etch stop layer 16, a p-type $2^{nd}$ cladding layer 17, a p-type cap layer 18, a current blocking layer 19, and a p-type contact layer 20 layered in the stated order. P-type contact layer 20 is depicted as being transparent for ease of viewing.

The layers from n-type cladding layer 13 to p-type 2nd cladding layer 17 structure an optical waveguide, and a reflective film (not depicted) is coated on a light-emission end surface (near end in FIG. 1) and the end surface opposite the light-emission end surface to thus structure an optical resonator.

The reflective film at the light-emission end is formed to have lower reflectance than the reflectance of the reflective film at the opposite end. This results in a strong laser beam emerging from the light-emission end surface, and a faint laser beam emerging from the opposite end surface. The former is for primary use, while the latter is received by a photodiode and used as a monitor of the output intensity of the former.

Regions extending for predetermined lengths from respective ends of the optical waveguide are disordered by the diffusion of impurities (e.g. Zn) to provide window regions 21 and 22 having a larger energy bandgap than an inner region of the optical waveguide.

P-type $2^{nd}$ cladding layer 17 and p-type cap layer 18 are provided in a ridge-shape extending in a lengthwise direction of the optical resonator.

Current blocking layer 19 is formed on both sides of the ridge, as well as over a $1^{st}$ region containing window region 21 and a $2^{nd}$ region containing window region 22.

Figure 2:
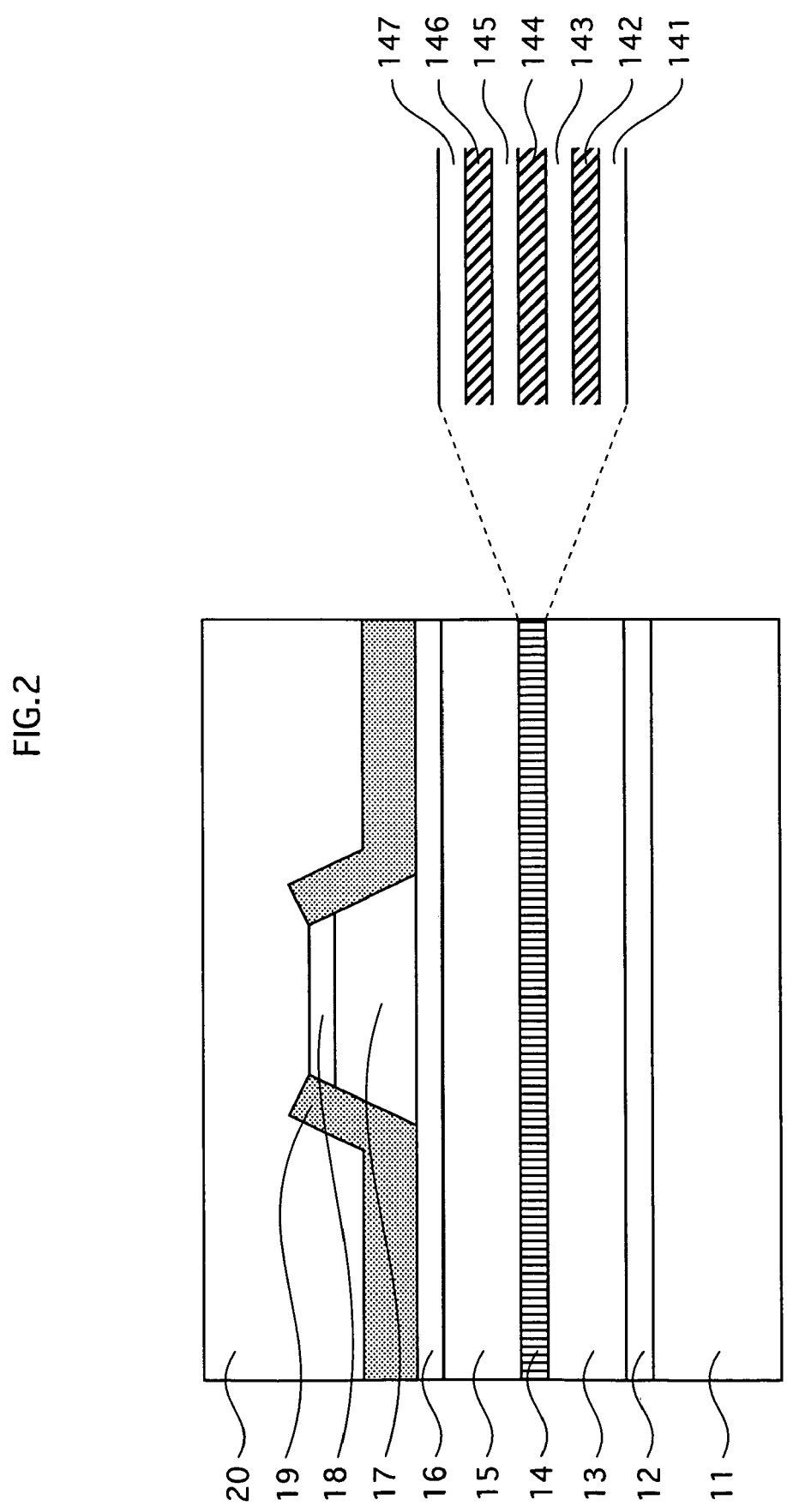
FIG. 2 is an X1–X1' sectional view of the semiconductor laser.

A detailed structure of quantum-well active layer 14 is shown in FIG. 2, which is a sectional view showing an X1–X1' cross-section of semiconductor laser 1.

Quantum-well active layer 14 is formed from an undoped guide layer 141, an undoped well layer 142, an undoped barrier layer 143, an undoped well layer 144, an undoped barrier layer 145, an undoped well layer 146, and an undoped guide layer 147 layered in the stated order.

Suitable film thicknesses, compositions and carrier densities of the layers in the present embodiment are shown in Table 1 (separate sheet).

Shape Characteristics of Window Regions 21/22 and Current Blocking Layer 19

It is known from the prior art that a window region and a current blocking layer covering the window region function to prevent COD (catastrophic optical damage) of the end surfaces in an optical waveguard. Commonly known technology for preventing COD involves the provision, from either end of a semiconductor laser, of window regions and a current blocking layer covering each window region, so that the window regions and current blocking layers are substantially the same size at both ends.

A feature of semiconductor laser 1 is the additional management of the horizontal divergence angle of the emerging laser beam, by using the distance taken for carriers to decrease to 1/e (e being the base of a natural logarithm) due to diffusion as a reference in determining the length of the current blocking layer covering the window region at the light-emission end of the waveguide.

Typically, the length of the current blocking layer is set to be at least 4% of the length of a region of the optical resonator not covered by the current blocking layer (i.e. gain region).

The inventors of the present invention confirmed that semiconductor laser 1, as a result of this structure, allows for a laser beam having a larger horizontal divergence angle θ∥ than the prior art to be obtained. The mechanisms and characteristic data relating to semiconductor laser 1 are detailed in a later section.

Manufacturing Method For Semiconductor Laser 1

Semiconductor laser 1, being similar in shape to a conventional ridge semiconductor laser, can be manufactured using a commonly known method. Semiconductor laser 1 may, for example, be manufactured as follows.

After growing the layers from n-type buffer layer 12 to p-type cap layer 18 over n-type semiconductor substrate 11, an impurity (e.g. Zn) may be diffused at both ends to form the window regions. Next, a dielectric insulating film made of $SiO_2$ or the like is formed over the entire surface, and photolithography is used to etch firstly the $SiO_2$, leaving only a band-shaped region that is to form the upper surface of the ridge, and then p-type $2^{nd}$ cladding layer 17 and p-type cap layer 18 on either side of the band-shaped region. The dielectric film at the light-emission end of the band-shaped region is then eliminated to a greater extent than the dielectric film at the opposite end, and current blocking layer 19 is selectively grown using the remaining $SiO_2$ as a mask. Finally, p-type contact layer 20 is grown after eliminated the remaining dielectric film.

Beam-Shaping Region and Mechanisms Thereof

Semiconductor laser 1 is described in relation to the mechanisms for emitting a laser beam having a larger horizontal divergence angle θ∥ than the prior art, as a result of the shape detailed above.

Figure 3:
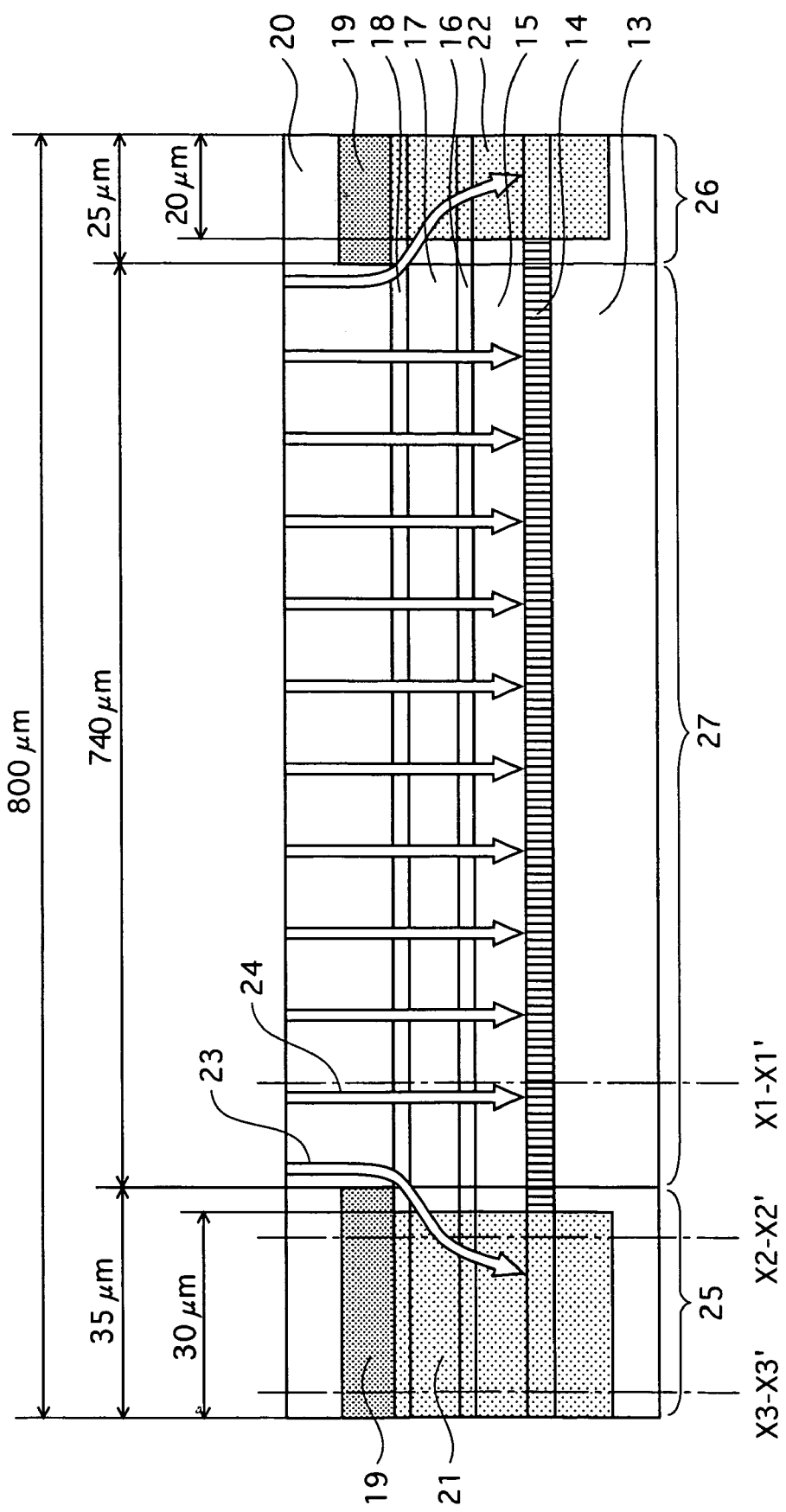
FIG. 3 is a schematic view showing carrier flow in a Z–Z' cross-section of the semiconductor laser.

FIG. 3 is a schematic view showing the flow of carriers (holes) in a Z–Z' cross-section of the semiconductor laser, and shows a main section as seen in the Z–Z' cross-section. The light-emission end surface is on the left in FIG. 3.

The regions of the optical waveguide to which current is not directly injected from p-type contact layer 20 due to being covered by current blocking layer 19 are here referred to as "non-current injection regions". Hereinafter, the non-current injection region at the light-emission end, distinguished in terms of its mechanism, is referred to as the "beam-shaping region".

As shown in FIG. 3, the optical waveguide is partitioned into a beam-shaping region 25 ($1^{st}$ region in the claims) extending for 35 μm from the light-emission end surface, a non-current injection region 26 ($2^{nd}$ region in the claims) extending for 25 μm from the opposite end surface, and a gain region 27 ($3^{rd}$ region in the claims) covering the remaining area, the gain region length being 740 μm. In this example, window region 21 is included in beam-shaping region 25, and window region 22 is included in non-current injection region 26.

Shortening window region 21 in comparison to beam-shaping region 25 increases absorption and raises the threshold current, while extending window region 21 allows current to flow directly into window region 21, inviting a drop in the COD level. The length of window region 21 is thus set in a ±20 μm range of the length of beam-shaping region 25, with the preferably range being ±10 μm.

In FIG. 3, an external electric field is applied orthogonal to the lengthwise direction of the optical resonator. The carriers in gain region 27 flow in the direction of the electric field (arrow 24). The carriers injected at the either end of gain region 27 expand so as to flow into beam-shaping region 25 and window region 21, due to the resistance of window region 21 having been lowered by the diffusion of impurities.

The carriers moving in the lengthwise direction of the optical resonator (i.e. carriers marked by arrow 23 flowing into beam-shaping region 25) move due to diffusion rather than the external electric field. The density of carriers in beam-shaping region 25 decreases exponentially as they move away from gain region 27.

Figure 4:
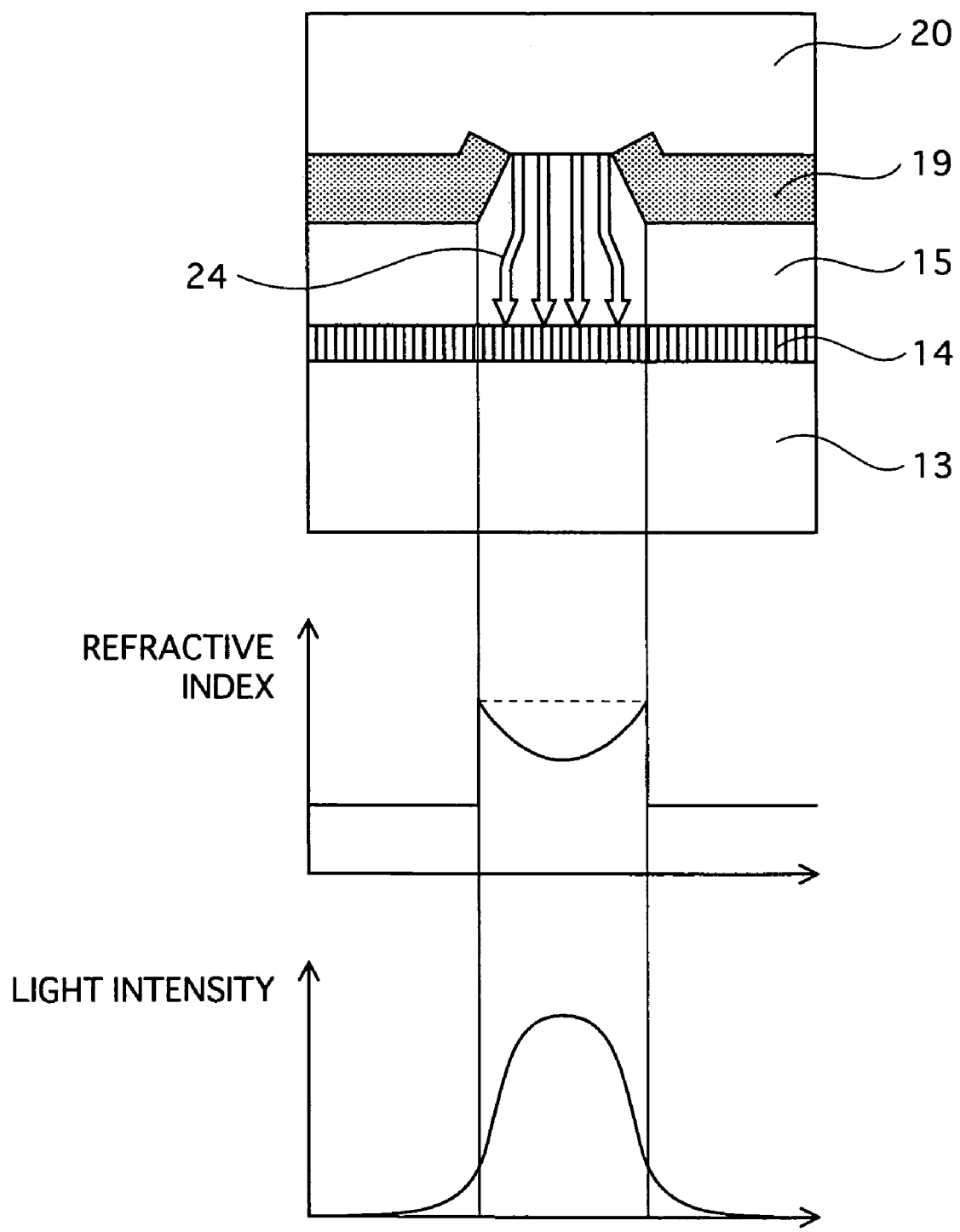
FIG. 4 is a schematic view showing carrier flow in the X1–X1' cross-section of the semiconductor laser, as well as the refractive index of an active layer and light intensity.

FIG. 4 is a schematic view showing the flow of carriers in the X1–X1' cross-section, as well as the refractive index of the active layer and the light intensity in the near field at a corresponding position.

Since the resistance of the p-type and n-type cladding layers in the X1–X1' cross-section has not been lowered (i.e. window regions not formed by disordering), the carrier spread is concentrated narrowly around a central vicinity of the ridge width. While it is known that the refractive index of active layer 14 drops due to the plasma effect when the carriers are injected, thus weakening the light confinement in the region whose refractive index has dropped, this cross-section shows that the region of weakened light confinement is limited to a central vicinity in a width direction of the ridge, and that the light intensity in the near field is concentrated comparatively well in the center of the ridge width.

Figure 5:
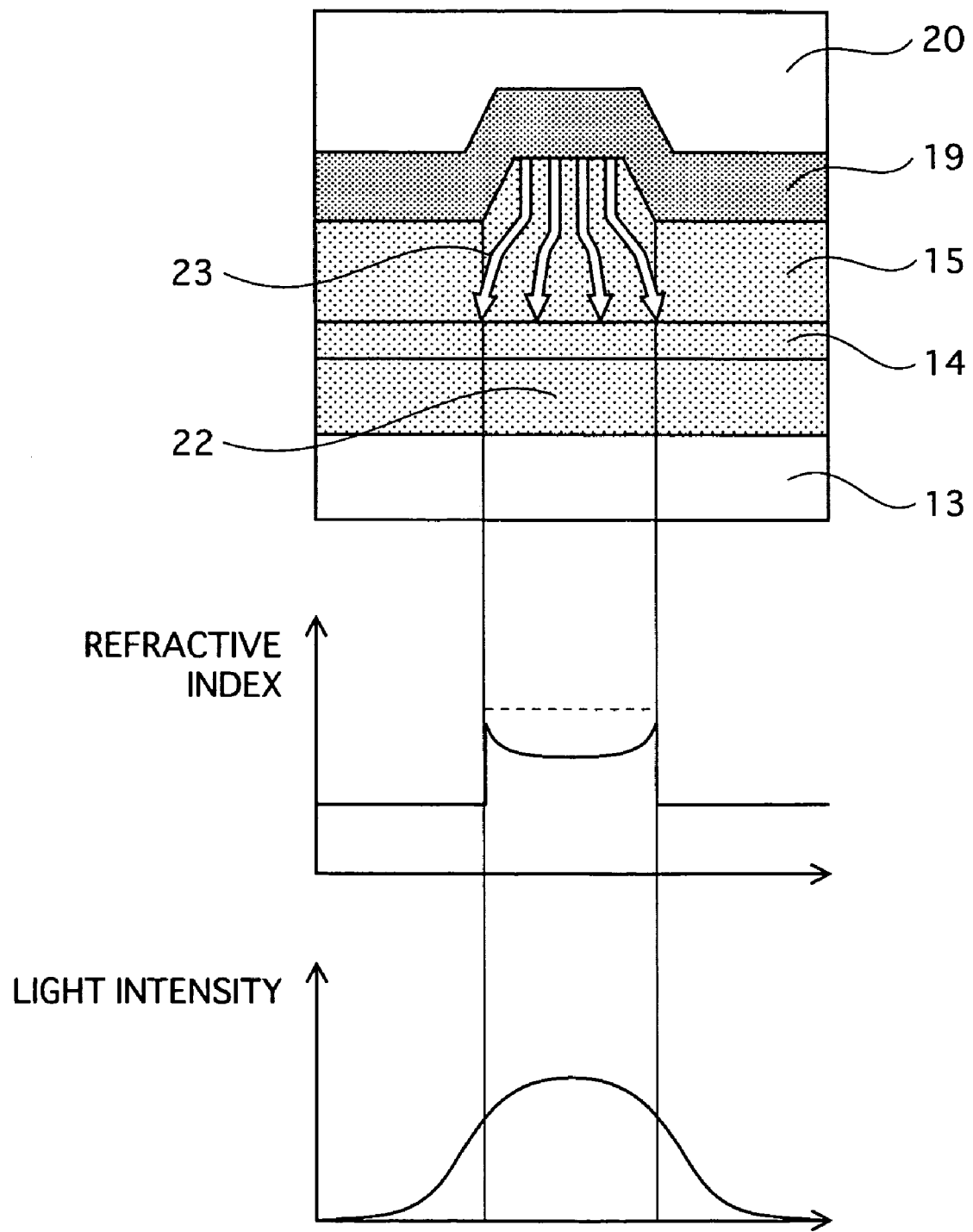
FIG. 5 is a schematic view showing carrier flow in an X2–X2' cross-section of the semiconductor laser, as well as the refractive index of the active layer and light intensity.

FIG. 5 is a schematic view showing the flow of carriers in an X2–X2' cross-section, as well as the refractive index of the active layer and the light intensity in the near field at a corresponding position.

Since the resistance of the p-type and n-type cladding layers in the X2–X2' cross-section has been lowered (i.e. window regions formed by disordering), the carriers flowing from the end of the gain region spread across the entire ridge width. The region in which light confinement is weakened due to the drop in the refractive index thus extends across the entire ridge width, and the light intensity in the near field spreads over a wide area.

Figure 6:
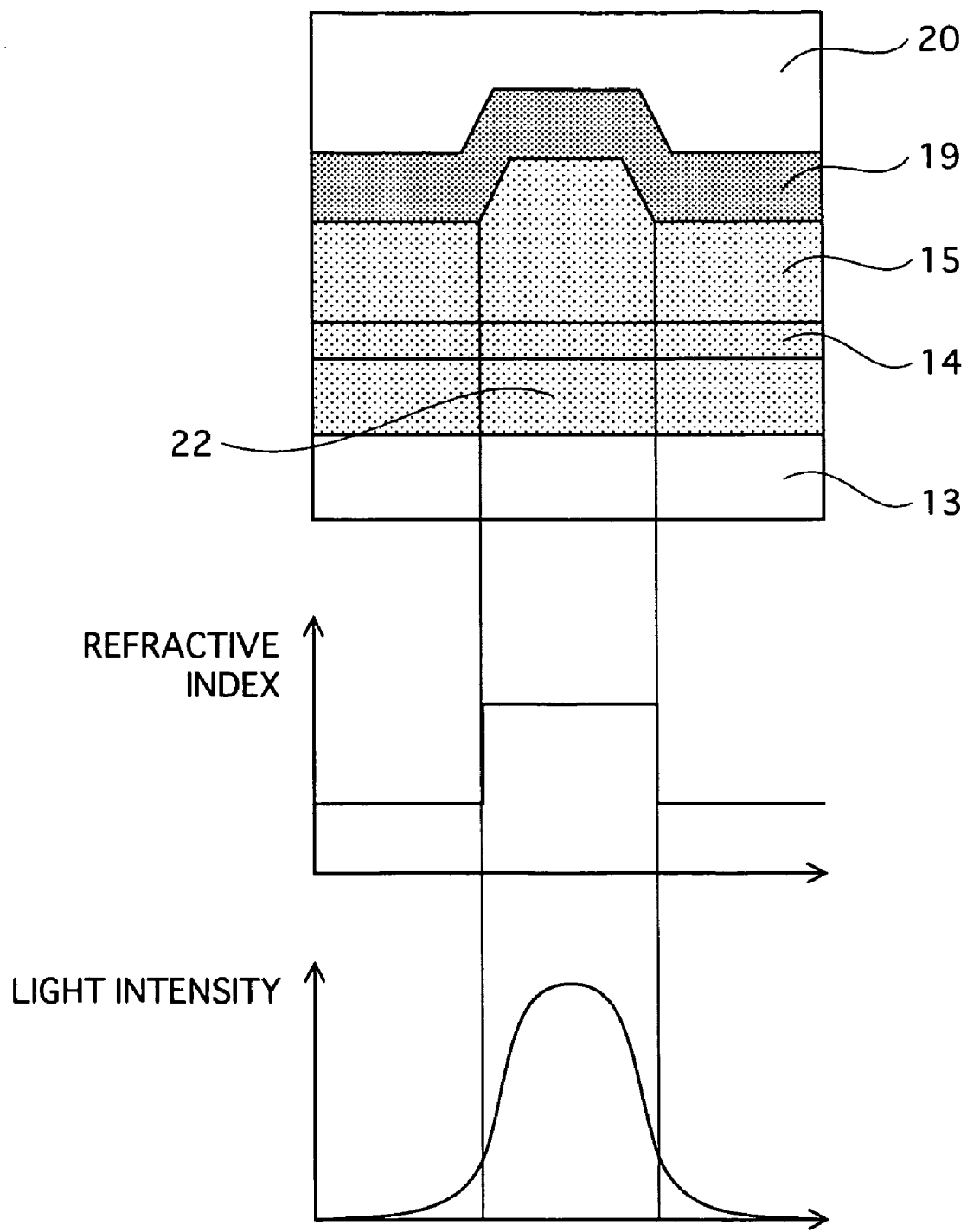
FIG. 6 is a schematic view showing carrier flow in an X3–X3' cross-section of the semiconductor laser, as well as the refractive index of the active layer and light intensity.

FIG. 6 is a schematic view showing the flow of carriers in an X3–X3' cross-section, as well as the refractive index of the active layer and the light intensity in the near field at a corresponding position.

While the resistance of the p-type and n-type cladding layers in the X3–X3' cross-section has been lowered (i.e. window regions formed by disordering), the carriers flowing from the end of the gain region do not reach the position shown in this cross-section. Thus there is no weakening of the light confinement in this cross-section, and light intensity in the near field is strongly concentrated in the center of the ridge width.

Figure 7:
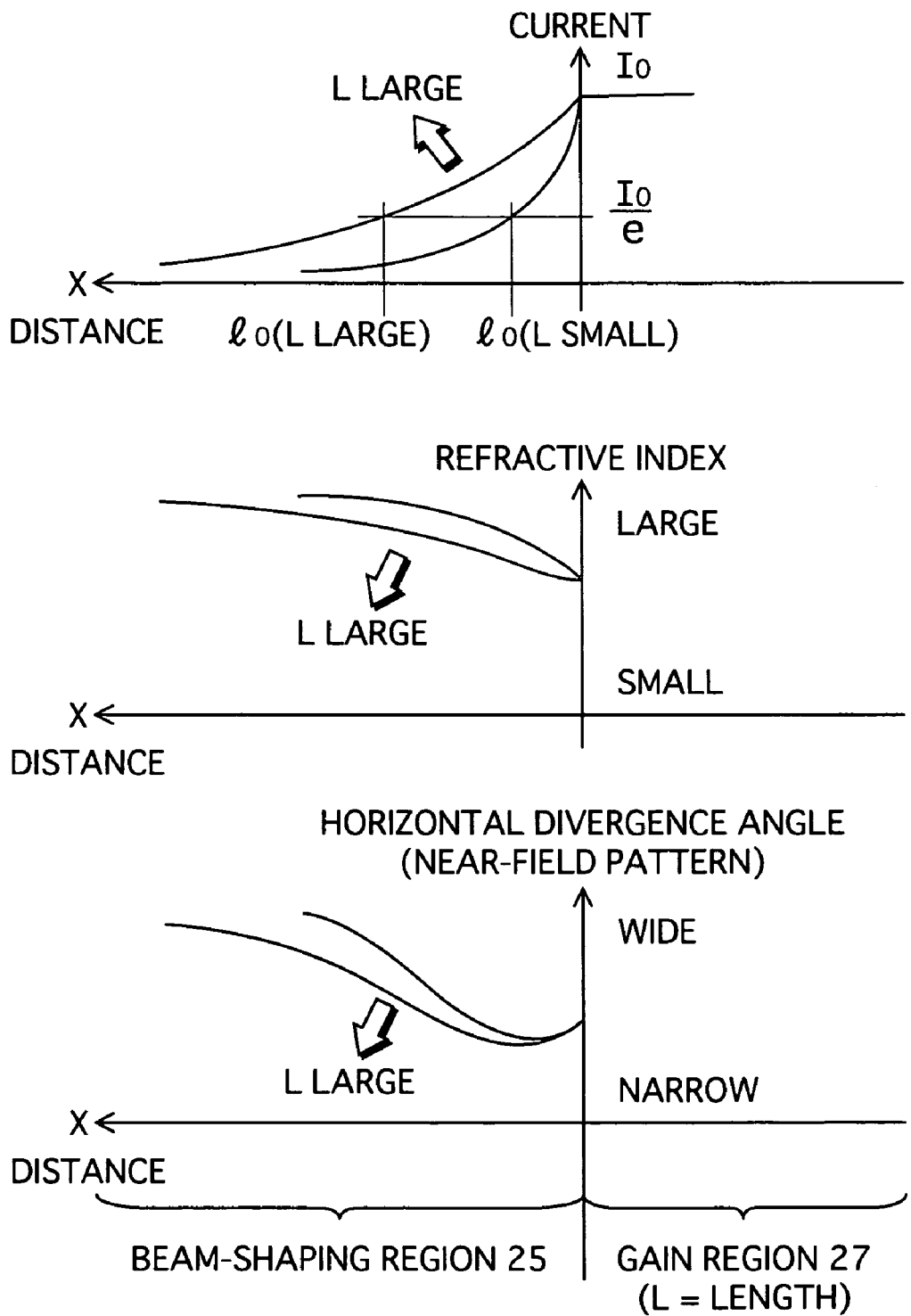
FIG. 7 is a graph showing the relation between the distance from a gain region and, respectively, the current, refractive index, and near-field horizontal divergence angle in a beam-shaping region.

FIG. 7 is a graph showing the relation between the distance from the gain region and, respectively, the current, refractive index, and near-field horizontal divergence angle in the beam-shaping region. The graph shifts in the direction of the outline arrow as the gain region is extended.

As described above, the current within beam-shaping region 25 decreases exponentially as the distance from gain region 27 increases, and as a consequence the refractive index and near-field horizontal divergence angle exhibit the characteristics shown in FIG. 7.

Here, when the distance taken for the carriers to decrease to 1/e (e being the base of a natural logarithm) is given as current diffusion distance $l_0$, the density of carriers reaching the light-emission end surface is decreased by extending the length of the beam-shaping region so as to be longer than current diffusion distance $l_0$, thus making it possible to prevent any drop in light confinement caused by a drop in the effective refractive index. As a result, light intensity in the near field at the light-emission end surface is concentrated strongly in the center of the ridge width, allowing a laser beam having a large horizontal divergence angle $\theta\|$ to emerge from the light-emission end surface.

Here, current diffusion distance $l_0$, which is determined using a gain region length L, a ridge width W and a cladding layer resistivity $\rho$, is given by, $$l_0 = 2W/(\beta \rho I_0)$$

Here, $\beta$, referred to as a connection parameter, is 19.3 C/J at room temperature. $I_0$ is given by the following equation.

$$I_0 = W\beta\rho(\sqrt{(1+W\beta\rho I/(2L))}-1)/(2L)$$

Here, I is the total injection current.

Figure 8:
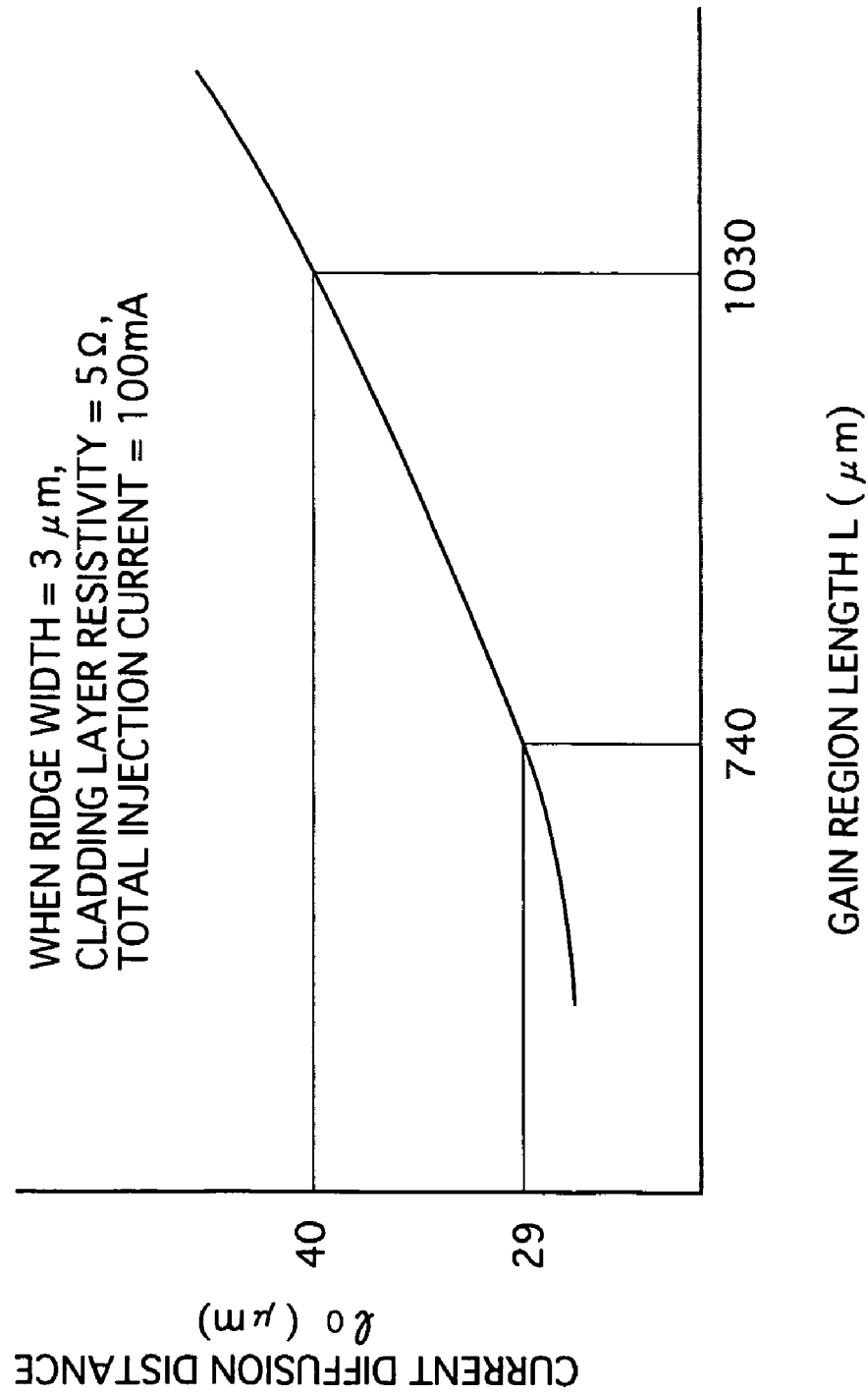
FIG. 8 is a graph showing a typical example of the relation between current diffusion distance and gain region length.

FIG. 8 is a graph showing current diffusion distance $l_0$ in relation to gain region length L when W=3 μm, $\rho$=5 Ω, and I=100 mA. When L=740 μm, $l_0$=approximately 29 μm (3.9% of gain region length), and when L=1030 μm, $l_0$=40 μm (3.9% of gain region length), with current diffusion distance $l_0$ increasing with increases in gain region length L.

To obtain a laser beam having a large horizontal divergence angle $\theta\|$, typically the length of the beam-shaping region is set to be at least 4% of the gain region length. Note that since the length of the window regions at the light-emission and opposite end surfaces does not affect the horizontal divergence angle $\theta\|$ of emerging light, they may be set to any length necessary to prevent COD (10 μm or greater).

Figure 9:
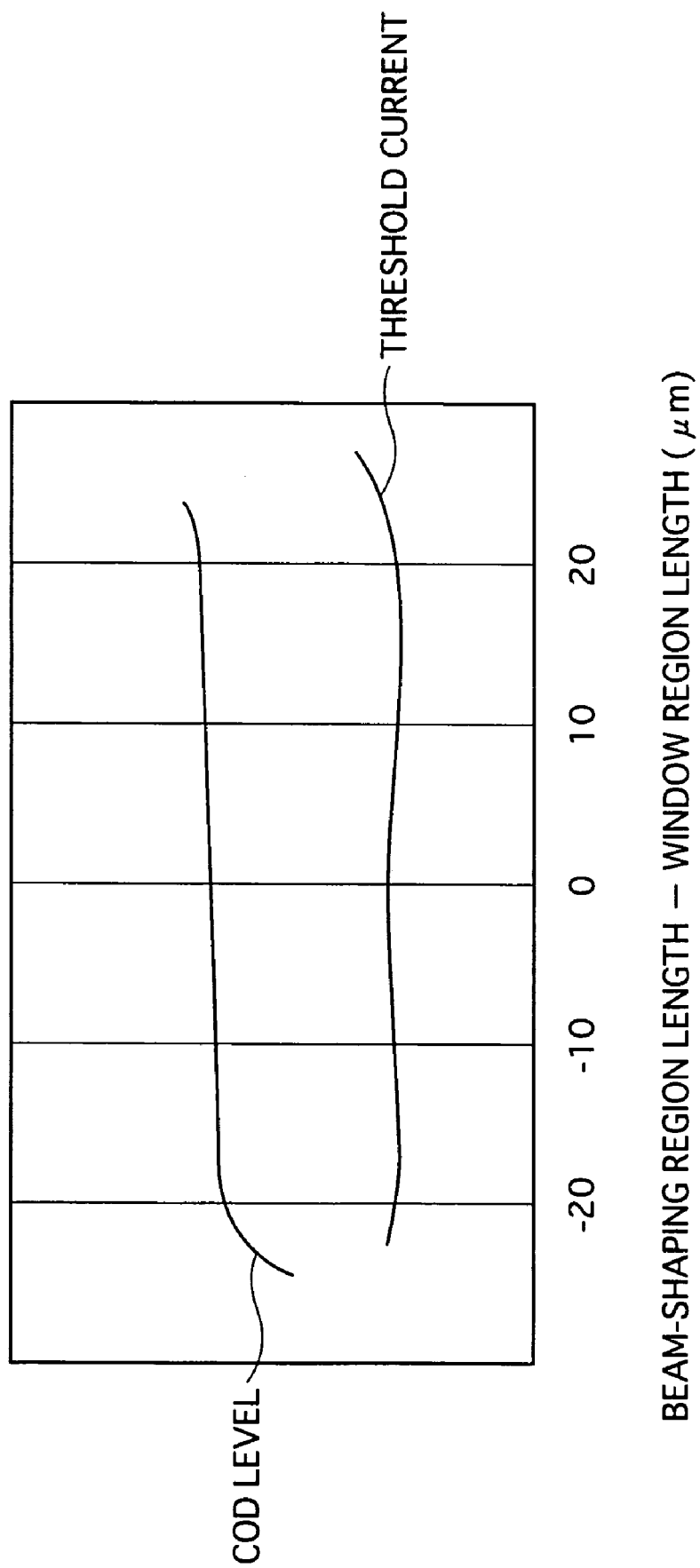
FIG. 9 is a graph showing the tendency with respect to a value obtained by subtracting the length of a window region from the length of a beam-shaping region for both a threshold current and a COD level of the semiconductor laser.

FIG. 9 is a graph showing the tendency with respect to a value obtained by subtracting window region length from beam-shaping region length for both the threshold current and COD level, and illustrates an example in which the length relation of window region 21 and beam-shaping region 25 in the semiconductor laser shown in FIG. 3 is changed. The length of window region 21 preferably is set within a ±10 μm range of the length of beam-shaping region 25, given that absorption increases with reductions in the length of window region 21 relative to the length of beam-shaping region 25, raising the threshold current, and that current flow to the window region increases with increases in the length of window region 21, inviting a drop in the COD level.

Characteristics

The inventors created a plurality of semiconductor lasers, each having the cross-sectional structure shown in FIG. 3 and Table 1, and different non-current injection region lengths at the light-emission and opposite end surfaces. The various characteristics obtained as a result of experiments using these semiconductor lasers are shown below.

Figure 10:
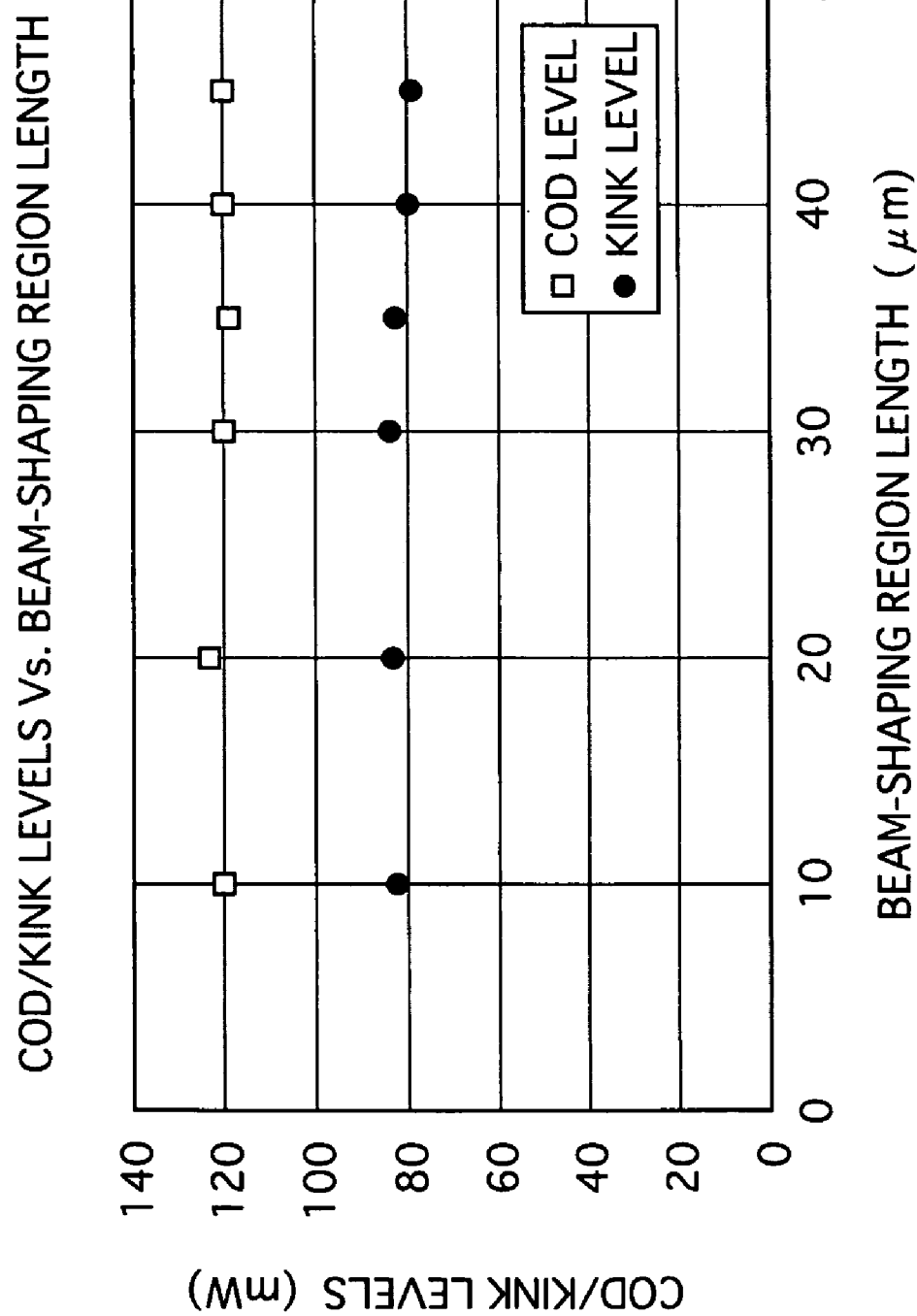
FIG. 10 is a graph showing COD/kink level characteristics relative the beam-shaping region length of the semiconductor laser.

FIG. 10 is a graph showing COD and kink level characteristics relative to beam-shaping region length, for an 800-μm chip resonator length and a 740-μm gain region length.

As shown in FIG. 10, the experiments confirmed that the beam-shaping region length at the light-emission end hardly impacts on either the COD level or kink level.

Figure 11:
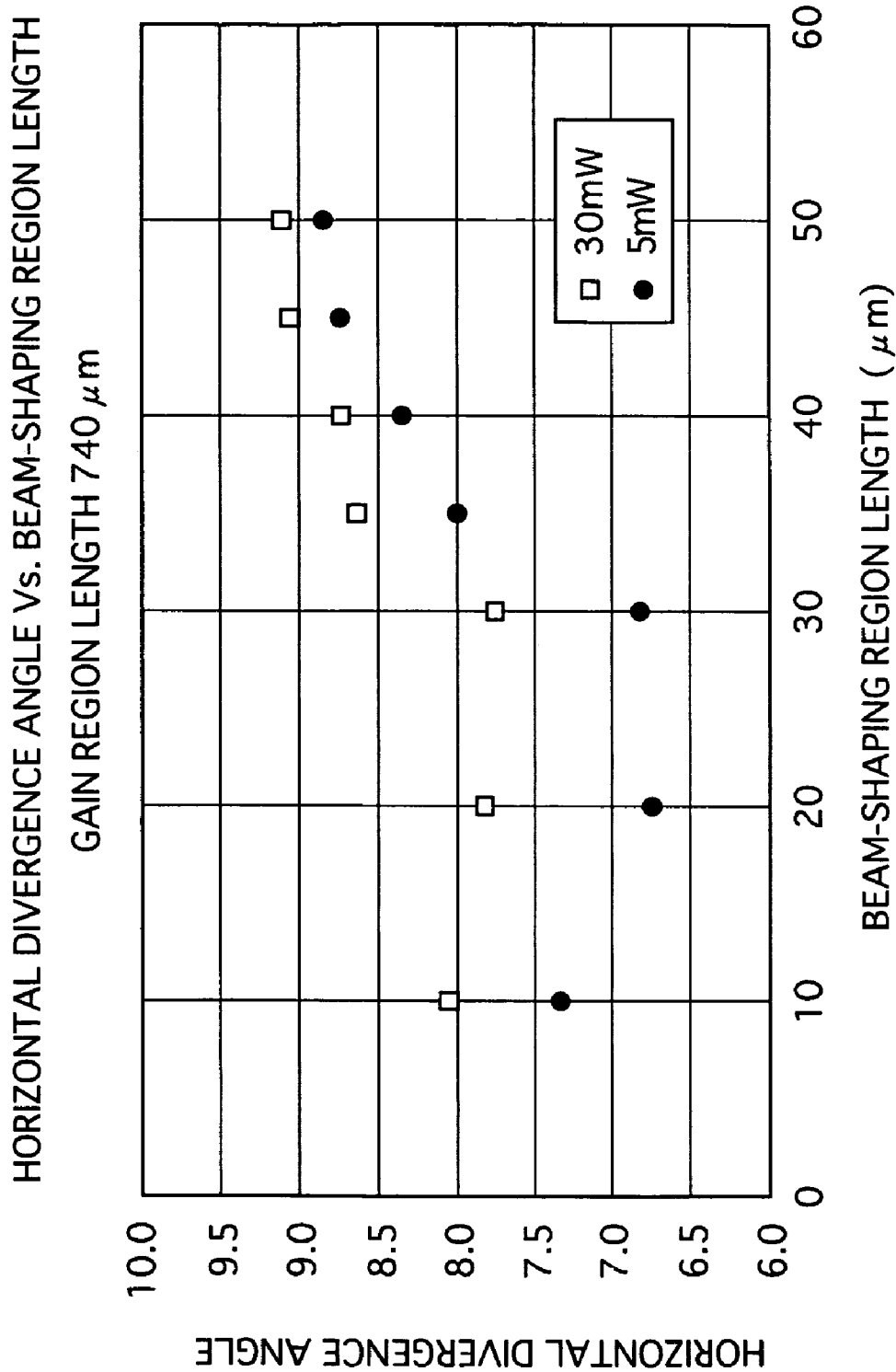
FIG. 11 is a graph showing horizontal divergence angle characteristics relative to the beam-shaping region length of the semiconductor laser, for a 740-μm gain region length.

FIG. 11 is a graph showing horizontal divergence angle characteristics relative to beam-shaping region length, for an 800-μm chip resonator length and a 740-μm gain region length.

As shown in FIG. 11, the experiments confirmed that, when the beam-shaping region length at the light-emission end is 35 μm or greater, (1) the horizontal divergence angle widens by approximately 1 degree at light outputs of both 30 mW and 5 mW, and (2) fluctuations in the horizontal divergence angle for changes in light output are suppressed.

Figure 12:
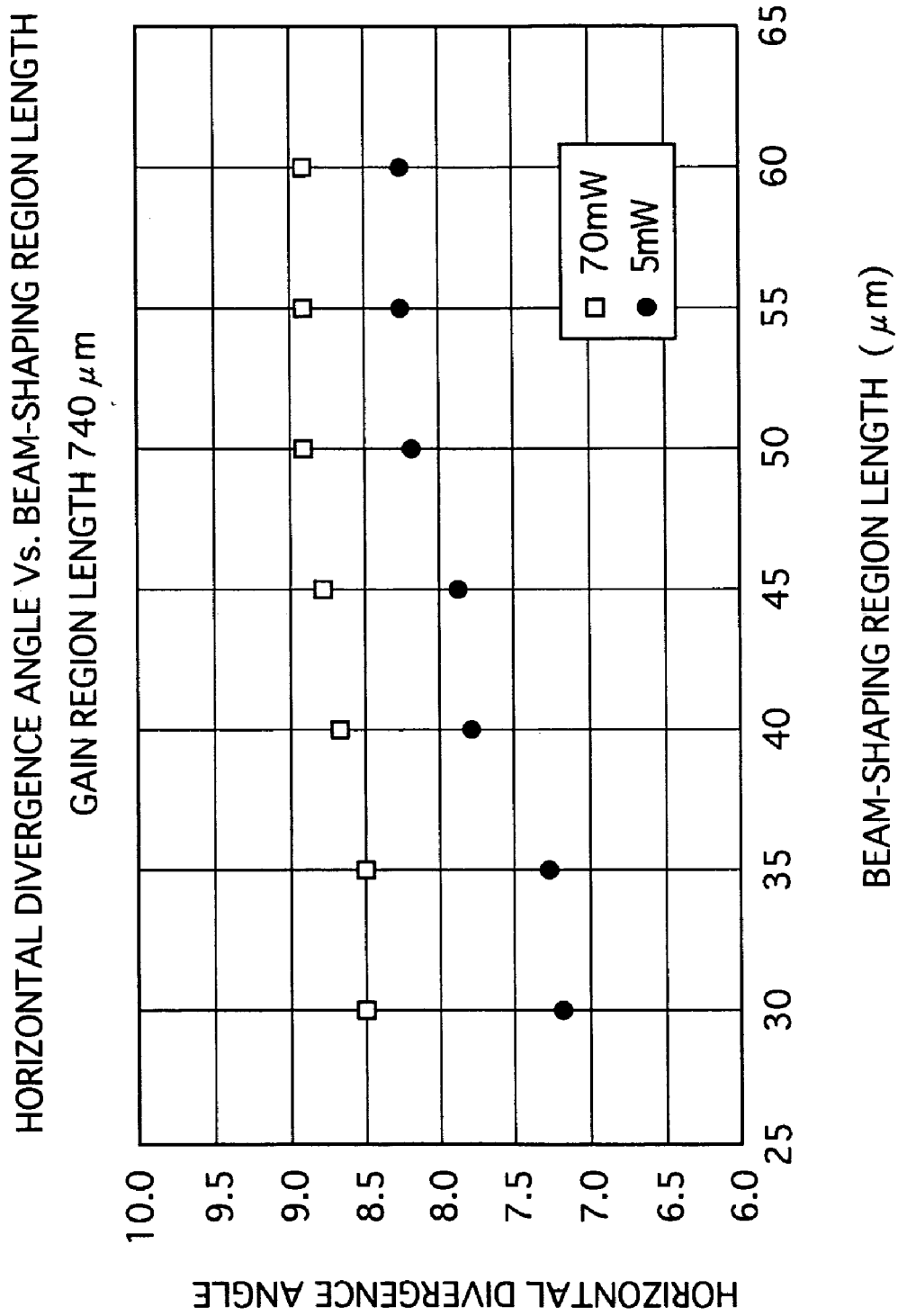
FIG. 12 is a graph showing horizontal divergence angle characteristics relative to the beam-shaping region length of the semiconductor laser, for a 1030-μm gain region length.

FIG. 12 is a graph showing horizontal divergence angle characteristics relative to beam-shaping region length, for a 1030-μm gain region length.

As shown in FIG. 12, the experiments confirmed that, when the beam-shaping region length at the light-emission end is 50 μm or greater, (1) the horizontal divergence angle widens by approximately 0.6 degrees at light outputs of both 70 mW and 5 mW, and (2) fluctuations in the horizontal divergence angle for changes in light output are suppressed.

Figure 13:
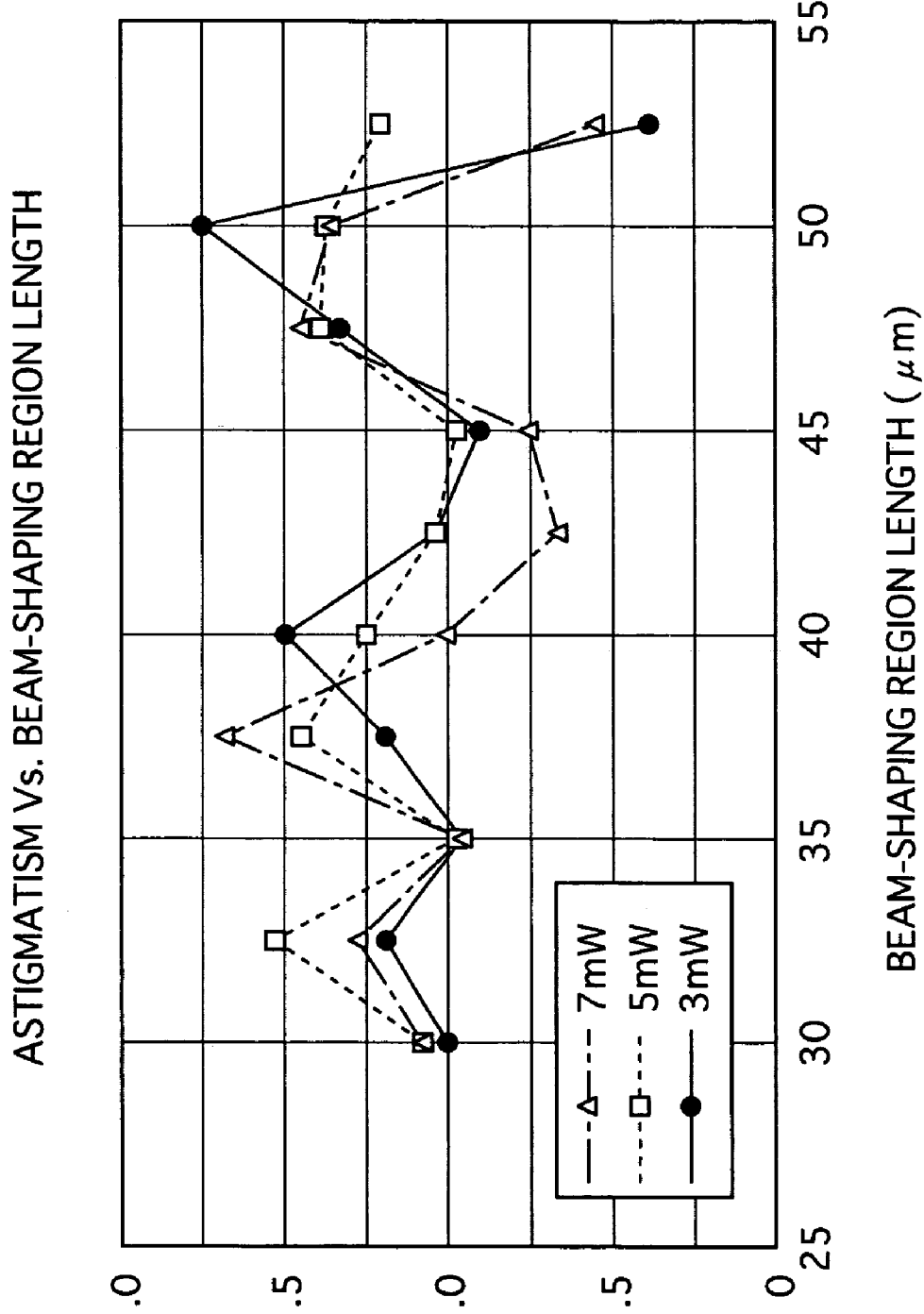
FIG. 13 is a graph showing astigmatism characteristics relative to the beam-shaping region length of the semiconductor laser.

FIG. 13 is a graph showing astigmatism characteristics relative to beam-shaping region length.

As shown in FIG. 13, the experiments confirmed that the beam-shaping region length hardly impacts on fluctuations in astigmatism when light output is changed.

Taking the lasers having an 800-μm chip resonator as an example, the characteristic data of the elements shows that a laser beam having a larger horizontal divergence angle than the prior art is obtained without adversely affecting COD and kink levels, if the length of the beam-shaping region at the light-emission end is independently set to be at least 30 μm, after having suitably designed the cross-sectional structure of the semiconductor laser and the length of the gain region so as to obtain favorable COD and kink levels.

The characteristic data also shows that fluctuations in the horizontal divergence angle in response to light output are suppressed if the beam-shaping region at the light-emission end is 35 μm or greater, thus making it possible to reduce the design margin relating to both the optics and the maximum value of light output.

Due to being able to manage the horizontal divergence angle of the laser beam independently of the various characteristics dependent on the cross-sectional structure and gain region length, by managing the length of the beam-shaping region at the light-emission end, and to suppress fluctuations in the horizontal divergence angle responding to light output, semiconductor laser design is rationalized, and it becomes possible, as a result, to simplify the design of semiconductor lasers having excellent characteristics over the prior art.

Exemplary Application in Dual-Wavelength Semiconductor Laser

Figure 14:
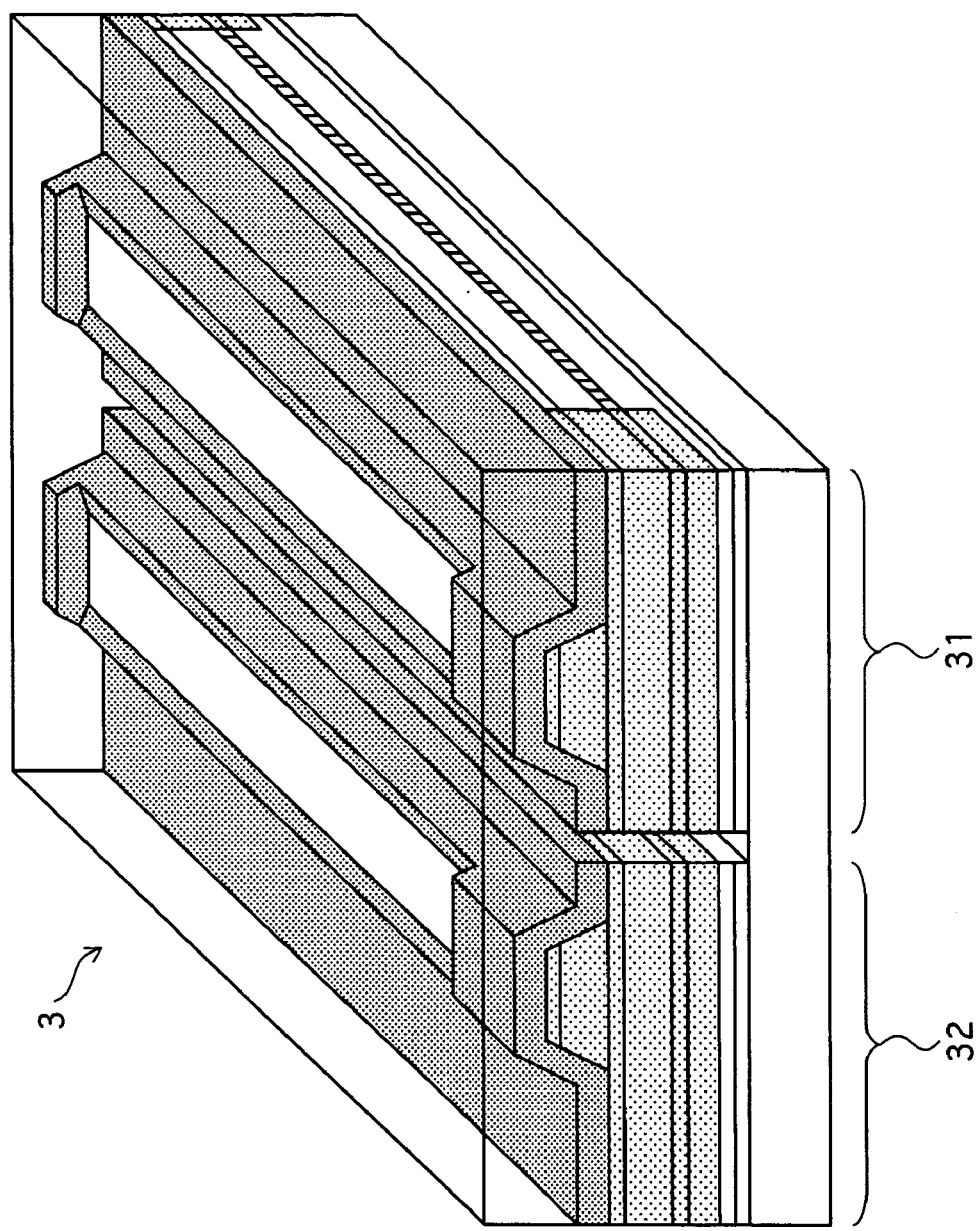
FIG. 14 is a perspective view showing a dual-wavelength semiconductor laser that applies the present invention.

FIG. 14 is a perspective view showing a dual-wavelength semiconductor laser 3 that applies the present invention.

With dual-wavelength semiconductor laser 3, an AlGaAs infrared semiconductor laser 31 and an InGaAlP red semiconductor laser 32 are formed, using monolithic integration, on a single n-GaAs substrate.

A feature of dual-wavelength semiconductor laser 3 is the provision at the light-emission end of a beam-shaping region larger than the current diffusion distance.

Note that a manufacturing method for a dual-wavelength semiconductor laser using monolithic integration is disclosed, for example, in Japanese Published Patent Application No. 2001-217504.

Exemplary Application of Groove-type Semiconductor Laser

Figure 15:
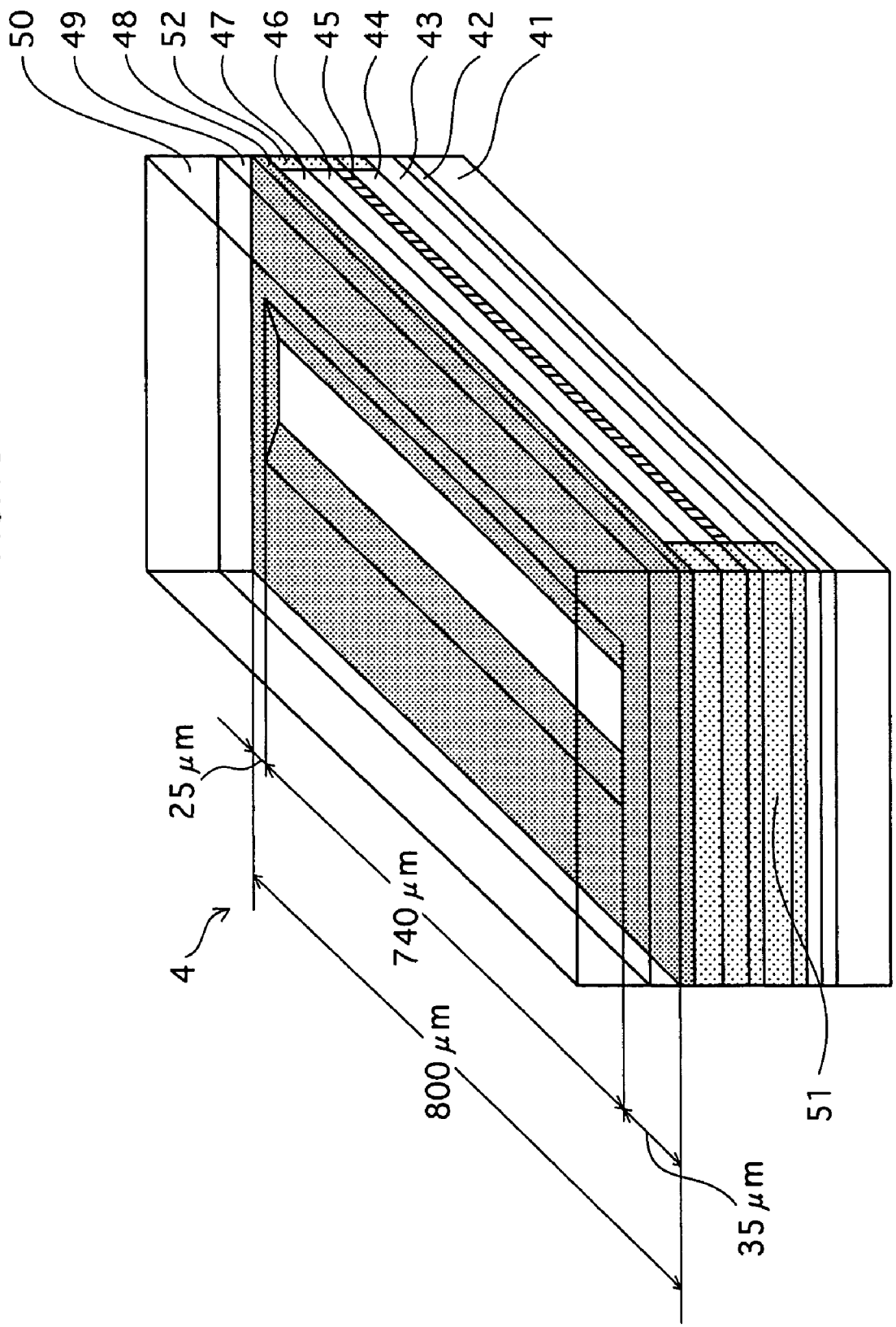
FIG. 15 is a perspective view showing a groove-type semiconductor laser that applies the present invention.

FIG. 15 is a perspective view showing a groove-type semiconductor laser 4 that applies the present invention.

Groove-type semiconductor laser 4 is formed from a GaAs substrate 41, a buffer layer 42, an n-type $1^{st}$ cladding layer 43, an n-type $2^{nd}$ cladding layer 44, a quantum-well active layer 45, a p-type $1^{st}$ cladding layer 46, a p-type $2^{nd}$ cladding layer 47, a current blocking layer 48, a p-type $3^{rd}$ cladding layer 49, and a contact layer 50 layered in the stated order. P-type $3^{rd}$ cladding layer 49 and contact layer 50 are depicted as being transparent for ease of viewing.

The layers from n-type $1^{st}$ cladding layer 43 to p-type $3^{rd}$ cladding layer 49 structure an optical waveguide, and a reflective film (not depicted) is coated on a light-emission end surface (near end in FIG. 15) of the optical waveguide and the end surface opposite the light-emission end surface to thus structure an optical resonator.

Regions 51 and 52 extending for predetermined lengths from respective end surfaces of the optical waveguide are formed as window regions by disordering.

Current blocking layer 48 is buried, between p-type $2^{nd}$ cladding layer 47 and p-type $3^{rd}$ cladding layer 49, in a region that excludes a central section of a band-shaped region extending the entire length of the optical resonator.

As shown in FIG. 15, the gain region length is 740 μm. Current blocking layer 48 is buried in regions extending for 35 μm from the light-emission end surface of the optical resonator and for 25 μm from the opposite end surface, and there is beam-shaping effect in the non-current injection region at the light-emission end.

Exemplary Application in Blue-Violet Semiconductor Laser

Figure 16:
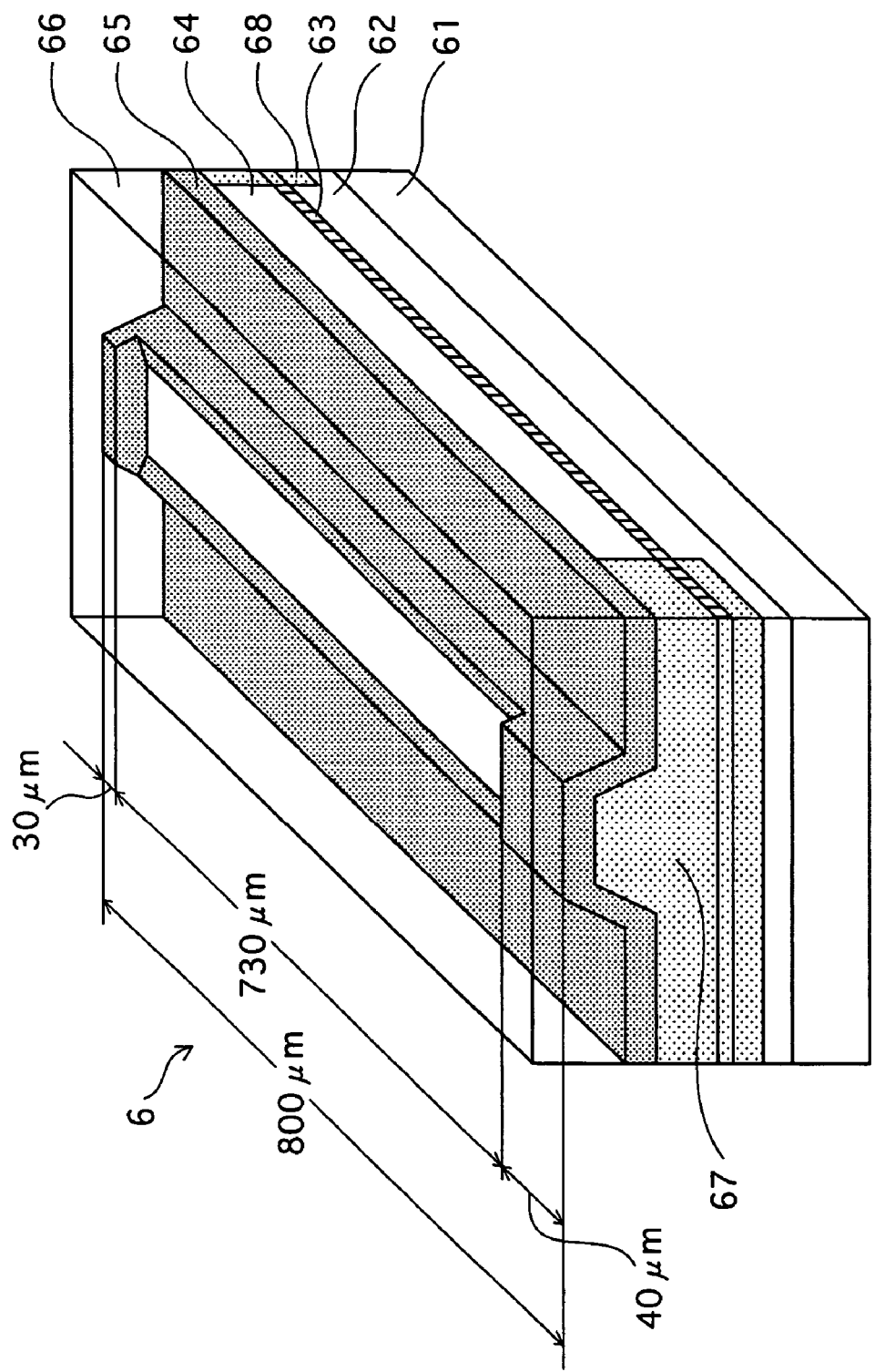
FIG. 16 is a perspective view showing a blue-violet semiconductor laser that applies the present invention.

FIG. 16 is a perspective view showing a blue-violet semiconductor laser 6 that applies the present invention.

Blue-violet semiconductor laser 6 is formed from an n-type GaN substrate 61, an n-type AlGaN cladding layer 62, a quantum-well active layer 63, a p-type AlGaN cladding layer 64, a current blocking layer 65, and a p-type GaN contact layer 66 layered in the stated order. P-type GaN contact layer 66 is depicted as being transparent for ease of viewing.

The layers from n-type AlGaN cladding layer 62 to p-type AlGaN cladding layer 64 structure an optical waveguide, and a reflective film (not depicted) is coated on a light-emission end surface (near end in FIG. 15) of the optical waveguide and the end surface opposite the light-emission end surface to thus structure an optical resonator.

Regions 67 and 68 extending for predetermined lengths from respective end surfaces of the optical waveguide are formed as window regions by disordering.

As shown in FIG. 16, the gain region length of blue-violet semiconductor laser 6 is 730 μm. Current blocking layer 65 covers regions extending for 40 μm from the light-emission end surface of the optical resonator and for 30 μm from the opposite end surface, and there is a beam-shaping effect in the non-current injection region at the light-emission end.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

TABLE 1

| CODE | LAYER | THICKNESS (μm) | COMPOSITION | CARRIER DENSITY (cm$^{-2}$) |
|---|---|---|---|---|
| 20 | p-type GaAs Contact Layer | 4 | p-GaAs | $2 \times 10^{18}$ |
| 19 | n-type AlInP Current Blocking Layer | 0.4 | n-Al$_{0.51}$In$_{0.49}$P | $2 \times 10^{18}$ |
| 18 | p-type GaInP Cap Layer | 0.05 | p-Ga$_{0.51}$In$_{0.49}$P | $2 \times 10^{18}$ |
| 17 | p-type AlGaInP 2nd Cladding Layer | 1 | p-(Al$_{0.7}$Ga$_{0.3}$)$_{0.51}$In$_{0.49}$P | $1 \times 10^{18}$ |
| 16 | p-type GaInP Etch Stop Layer | 0.01 | p-Ga$_{0.56}$In$_{0.44}$P | $2 \times 10^{18}$ |
| 15 | p-type AlGaInP 1st Cladding Layer | 0.2 | p-(Al$_{0.7}$Ga$_{0.3}$)$_{0.51}$In$_{0.49}$P | $5 \times 10^{17}$ |
| 147 | Guide Layer | 0.025 | un-(Al$_{0.5}$Ga$_{0.5}$)$_{0.51}$In$_{0.49}$P | |
| 146 | Well Layer | 0.005 | un-Ga$_{0.46}$In$_{0.54}$P | |
| 145 | Barrier Layer | 0.005 | un-(Al$_{0.5}$Ga$_{0.5}$)$_{0.51}$In$_{0.49}$P | |
| 144 | Well Layer | 0.005 | un-Ga$_{0.46}$In$_{0.54}$P | |
| 143 | Barrier Layer | 0.005 | un-(Al$_{0.5}$Ga$_{0.5}$)$_{0.51}$In$_{0.49}$P | |
| 142 | Well Layer | 0.005 | un-Ga$_{0.46}$In$_{0.54}$P | |
| 141 | Guide Layer | 0.025 | un-(Al$_{0.5}$Ga$_{0.5}$)$_{0.51}$In$_{0.49}$P | |
| 13 | n-type AlGaInP Cladding Layer | 2 | n-(Al$_{0.7}$Ga$_{0.3}$)$_{0.51}$In$_{0.49}$P | $1 \times 10^{18}$ |
| 12 | n-type GaAs Buffer Layer | 0.5 | n-GaAs | $1 \times 10^{18}$ |
| 11 | n-type GaAs Substrate | 120 | n-GaAs | $2 \times 10^{18}$ |

What is claimed is:

1. A semiconductor laser comprising:

an optical resonator formed by processing either end of an optical waveguide to be a partially reflective surface, the optical waveguide being formed from a $1^{st}$ conductive-type cladding layer, an active layer and a $2^{nd}$ conductive-type cladding layer layered in the stated order; and a current blocking layer formed on $1^{st}$ and $2^{nd}$ regions of the optical resonator, the $1^{st}$ region extending a $1^{st}$ length from a light-emission end surface of the optical resonator and the $2^{nd}$ region extending a $2^{nd}$ length from an opposite end surface of the optical resonator, wherein a section of the active layer extending a predetermined length from the light-emission end surface and a section of the active layer extending a predetermined length from the opposite end surface are formed to have an energy bandgap larger than a remaining section thereof, and a horizontal divergence angle of light emerging from the light-emission end surface is managed by setting the $1^{st}$ length to be longer than a distance over which current flowing into the $1^{st}$ region from a $3^{rd}$ region of the optical resonator that excludes the $1^{st}$ and $2^{nd}$ regions is reduced to 1/e by diffusion, where e is a base of a natural logarithm.

2. The semiconductor laser of claim 1, wherein the $1^{st}$ length is at least 4% of the length of the $3^{rd}$ region.

3. The semiconductor laser of claim 1, wherein a section of the active layer extending from the light-emission end surface for a length included in a ±20 μm range of the $1^{st}$ length is formed to have the larger energy bandgap.

* * * * *